US012597458B2

(12) United States Patent
Liou et al.

(10) Patent No.:     US 12,597,458 B2
(45) Date of Patent:          Apr. 7, 2026

(54) WRITE LEVELING IN DDR MEMORY DEVICE AND OPERATING METHOD THEREOF

(71) Applicant: Elite Semiconductor Microelectronics Technology Inc., Hsinchu (TW)

(72) Inventors: Jian-Sing Liou, Hsinchu (TW); Shu-Han Nien, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 144 days.

(21) Appl. No.: 18/629,906

(22) Filed: Apr. 8, 2024

(65) Prior Publication Data

US 2025/0316303 A1     Oct. 9, 2025

(51) Int. Cl.
| | |
|---|---|
| *G11C 11/4076* | (2006.01) |
| *G11C 7/10* | (2006.01) |
| *G11C 7/22* | (2006.01) |
| *G11C 11/4096* | (2006.01) |
| G11C 8/18 | (2006.01) |

(52) U.S. Cl.
CPC ........ *G11C 11/4076* (2013.01); *G11C 7/1072* (2013.01); *G11C 7/222* (2013.01); *G11C 11/4096* (2013.01); *G11C 8/18* (2013.01)

(58) Field of Classification Search
CPC ... G11C 11/4076; G11C 7/1072; G11C 7/222; G11C 11/4096; G11C 8/18
See application file for complete search history.

(56) References Cited

U.S. PATENT DOCUMENTS

| | | | | |
|---|---|---|---|---|
| 8,780,653 | B2 | 7/2014 | Ito | |
| 8,917,113 | B1 * | 12/2014 | Song | G01R 25/00 |
| | | | | 327/12 |
| 9,892,772 | B2 | 2/2018 | Song | |
| 11,145,343 | B1 | 10/2021 | Subramanian | |
| 2007/0201286 | A1 * | 8/2007 | Oh | G11C 11/4096 |
| | | | | 365/194 |
| 2009/0161453 | A1 * | 6/2009 | Giovannini | G11C 11/409 |
| | | | | 365/194 |
| 2011/0047319 | A1 * | 2/2011 | Jeon | G06F 13/4243 |
| | | | | 711/E12.001 |
| 2013/0141994 | A1 * | 6/2013 | Ito | G11C 7/222 |
| | | | | 365/193 |

(Continued)

FOREIGN PATENT DOCUMENTS

| | | |
|---|---|---|
| CN | 110197679 | 9/2019 |
| TW | I765844 B | 5/2022 |

*Primary Examiner* — Mushfique Siddique
(74) *Attorney, Agent, or Firm* — Winston Hsu

(57) ABSTRACT

A write leveling system includes a frequency divider, a signal processing circuit, and a data control circuit. The frequency divider is arranged to perform a frequency dividing operation upon a clock signal to generate multiple frequency-divided clock signals. The signal processing circuit is arranged to perform signal processing upon a data strobe signal to generate multiple processed data strobe signals. The data control circuit is arranged to generate a data signal according to the multiple frequency-divided clock signals and the multiple processed data strobe signals, for indicating whether a rising edge of the data strobe signal is located at a first level or a second level of the clock signal, wherein the first level is higher than the second level.

12 Claims, 5 Drawing Sheets

(56)                References Cited

U.S. PATENT DOCUMENTS

2013/0155792 A1 *   6/2013   Matsui ..................... G11C 8/18
                                                          365/219
2015/0063044 A1 *   3/2015   Byun ....................... G11C 7/22
                                                          327/174
2018/0012638 A1 *   1/2018   Kang .................. G11C 11/4076

* cited by examiner

WRITE LEVELING IN DDR MEMORY DEVICE AND OPERATING METHOD THEREOF

BACKGROUND OF THE INVENTION

1. Field of the Invention

The present invention is related to a double data rate (DDR) synchronous dynamic random access memory (SDRAM), and more particularly, to a write leveling system that can perform a write leveling operation by frequency division and data control within the DDR SDRAM, and an associated storage device.

2. Description of the Prior Art

With the development of the DDR SDRAM, frequency dividing operations are usually performed upon a clock signal with a high-speed frequency and a data strobe (DQS) signal to generate multiple frequency-divided clock signals and multiple frequency-divided DQS signals, for performing a data writing operation. For the LPDDR4, during a write leveling operation, the DDR SDRAM receives the clock signal and the DQS signal from a memory controller, and generate and transmit a data (DQ) signal back to the memory controller according to the clock signal and the DQS signal, for indicating whether a rising edge of the DQS signal is located at a high level or a low level of the clock signal. The memory controller may then determine whether to delay the DQS signal according to the DQ signal for successfully performing the data writing operation. For a conventional storage device including the memory controller and the DDR SDRAM, the clock signal and the DQS signal may be used to perform the write leveling operation through multiple delay circuits (e.g., multiple inverters) that imitate a delay of a normal data writing path. Some problems may occur, however. Under a condition that process, voltage, and temperature (PVT) varies, and the LPDDR4 specification only allows tDQSS to have a tolerance value of 1±0.25 tck (clock cycle time; i.e., at the fastest current clock speed, the clock cycle time tck is 0.46 nanoseconds (ns)), there may be a difference between a delay of the delay circuits and that of the normal data writing path, thereby causing errors in the subsequent data writing operation. As a result, a novel write leveling system that can perform the write leveling operation by frequency division and data control within the DDR SDRAM, and an associated storage device are urgently needed.

SUMMARY OF THE INVENTION

It is therefore one of the objectives of the present invention to provide a write leveling system that can perform a write leveling operation by frequency division and data control within the DDR SDRAM, and an associated storage device, to address the above-mentioned issues.

According to an embodiment of the present invention, a write leveling system is provided. The write leveling system may comprise a frequency divider, a signal processing circuit, and a data control circuit. The frequency divider may be arranged to perform a frequency dividing operation upon a clock signal to generate multiple frequency-divided clock signals. The signal processing circuit may be arranged to perform signal processing upon a data strobe signal to generate multiple processed data strobe signals. The data control circuit may be arranged to generate a data signal according to the multiple frequency-divided clock signals and the multiple processed data strobe signals, for indicating whether a rising edge of the data strobe signal is located at a first level or a second level of the clock signal, wherein the first level is higher than the second level.

According to an embodiment of the present invention, a storage device is provided. The storage device may include a memory controller and a write leveling system. The write leveling system may comprise a frequency divider, a signal processing circuit, a data control circuit, and a data pin. The frequency divider may be arranged to receive a clock signal from the memory controller, and perform frequency dividing operation upon the clock signal to generate multiple frequency-divided clock signals. The signal processing circuit may be arranged to receive a data strobe signal from the memory controller, and perform signal processing upon the data strobe signal to generate multiple processed data strobe signals. The data control circuit may be arranged to generate a data signal according to the multiple frequency-divided clock signals and the multiple processed data strobe signals, for indicating whether the data strobe signal is located at a first level or a second level of the clock signal, wherein the first level is higher than the second level. The data pin may be arranged to receive the data signal from the data control circuit, and transmit the data signal to the memory controller.

One of the benefits of the present invention is that, compared with a case where a clock signal and a DQS signal are transmitted from a memory controller to a DDR SDRAM through multiple delay circuits (e.g., multiple inverters) for performing a write leveling operation, the write leveling system of the present invention performs the write leveling operation by frequency division and data control within the DDR SDRAM, which can avoid signal delay problems caused by process, voltage, and temperature (PVT) variation for the delay circuits (e.g., skew margin reduction between the DQS signal and the clock signal during a data writing operation). In this way, the accuracy of a data writing operation can be improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
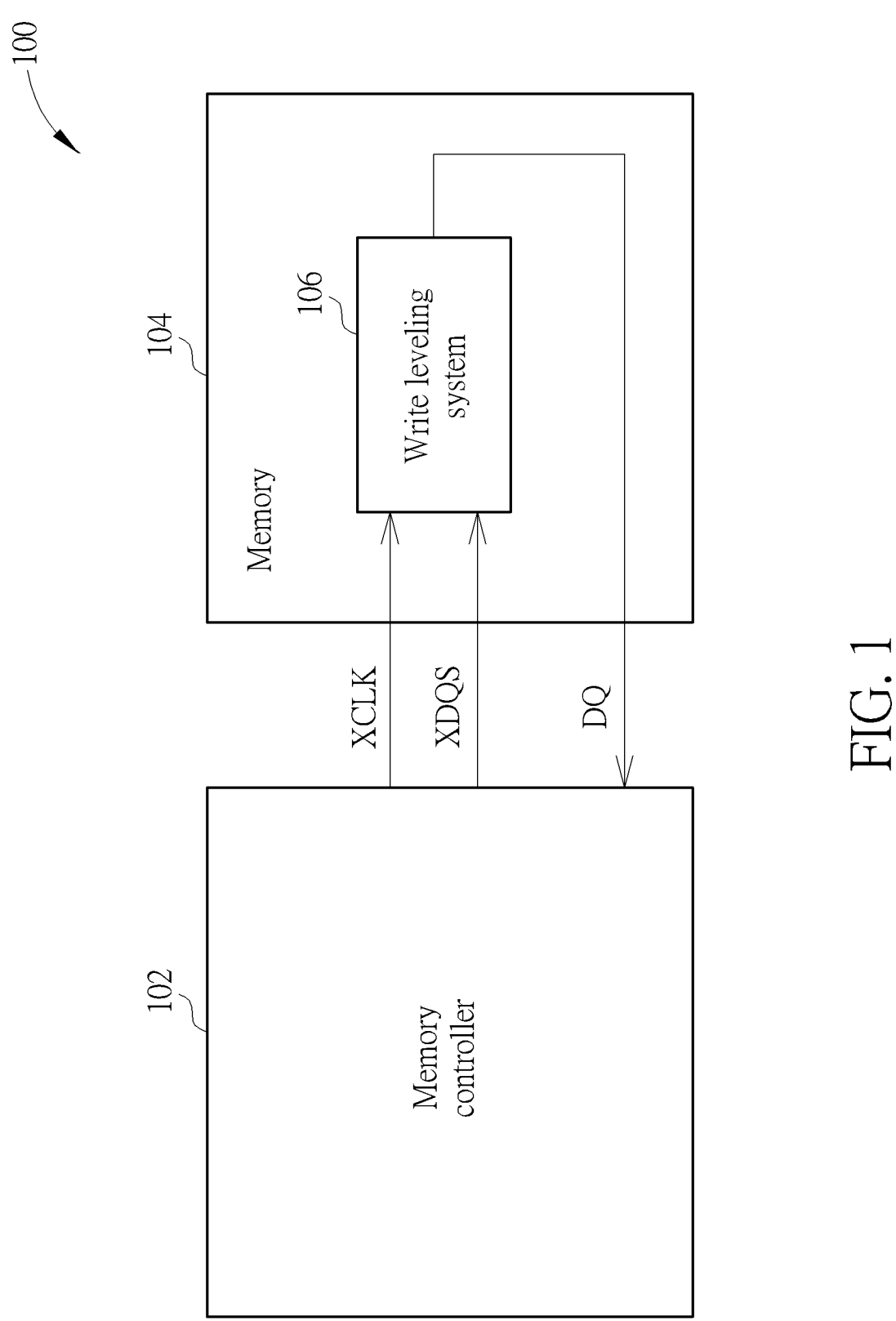
FIG. 1 is a diagram illustrating a storage device according to an embodiment of the present invention.

FIG. 1 is a diagram illustrating a storage device 100 according to an embodiment of the present invention. As shown in FIG. 1, the storage device 100 may include a memory controller 102 and a memory (e.g. a double data rate (DDR) synchronous dynamic random access memory (SDRAM)) 104, wherein the memory 104 may include a write leveling system 106. In response to the memory 104 being in a write leveling mode, the memory controller 102 may transmit a clock signal XCLK and a data strobe (DQS) signal XDQS to the memory 104 (more particularly, the write leveling system 106 of the memory 104). The write leveling system 106 may be arranged to perform a frequency dividing operation upon the clock signal XCLK to generate multiple frequency-divided clock signals, perform signal processing upon the DQS signal XDQS to generate multiple processed DQS signals, and generate and transmit a data (DQ) signal DQ to the memory controller 102 according to the multiple frequency-divided clock signals and the multiple processed DQS signals, for indicating whether a rising edge of the DQS signal XDQS is located at a high level (e.g., a logic value "1") or a low level (e.g., a logic value "0") of the clock signal XCLK. The memory controller 102 may then determine whether to delay the DQS signal XDQS according to the DQ signal DQ for successfully performing a data writing operation.

Figure 2:
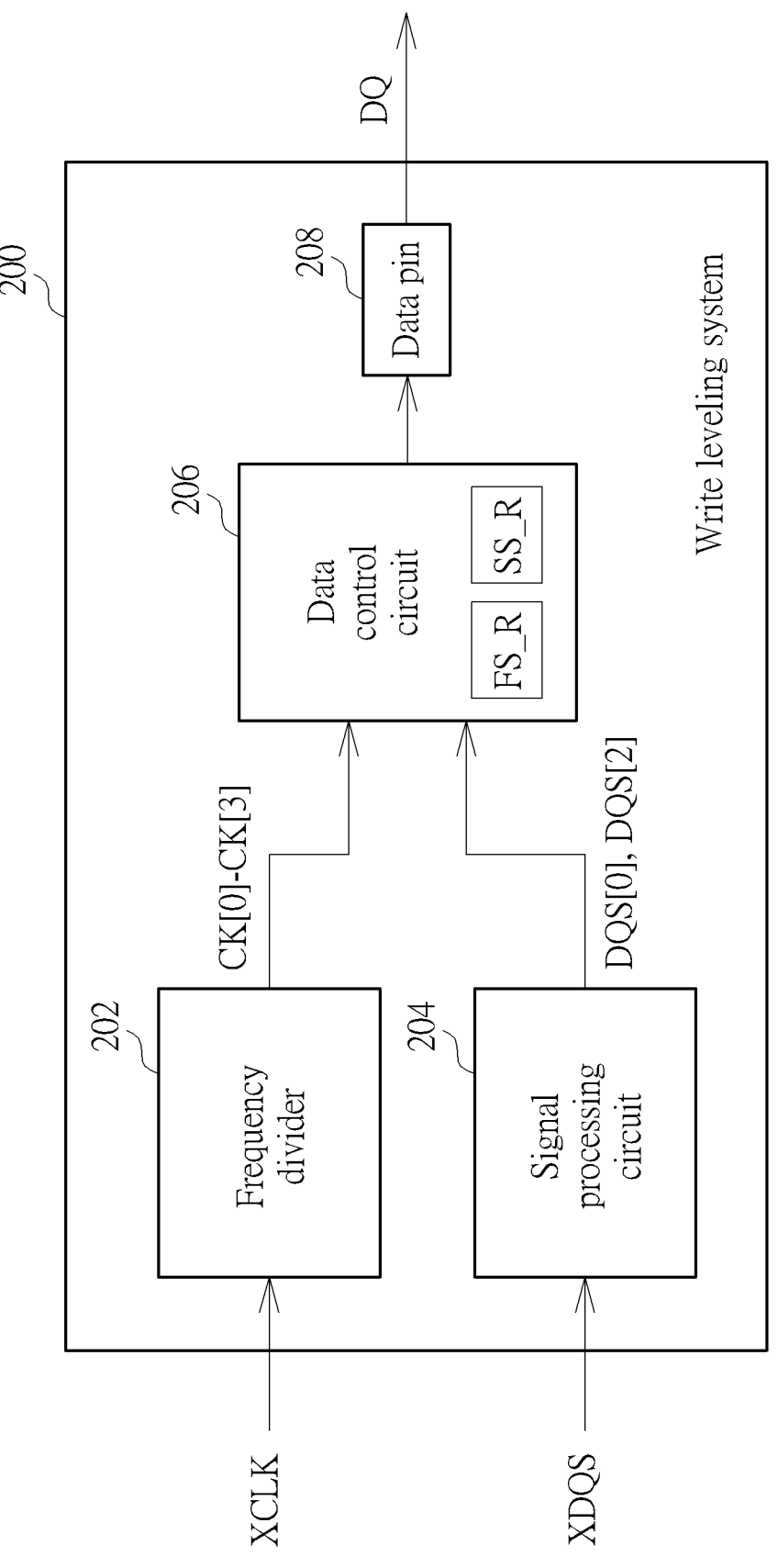
FIG. 2 is a diagram illustrating a write leveling system according to an embodiment of the present invention.
Figure 3:
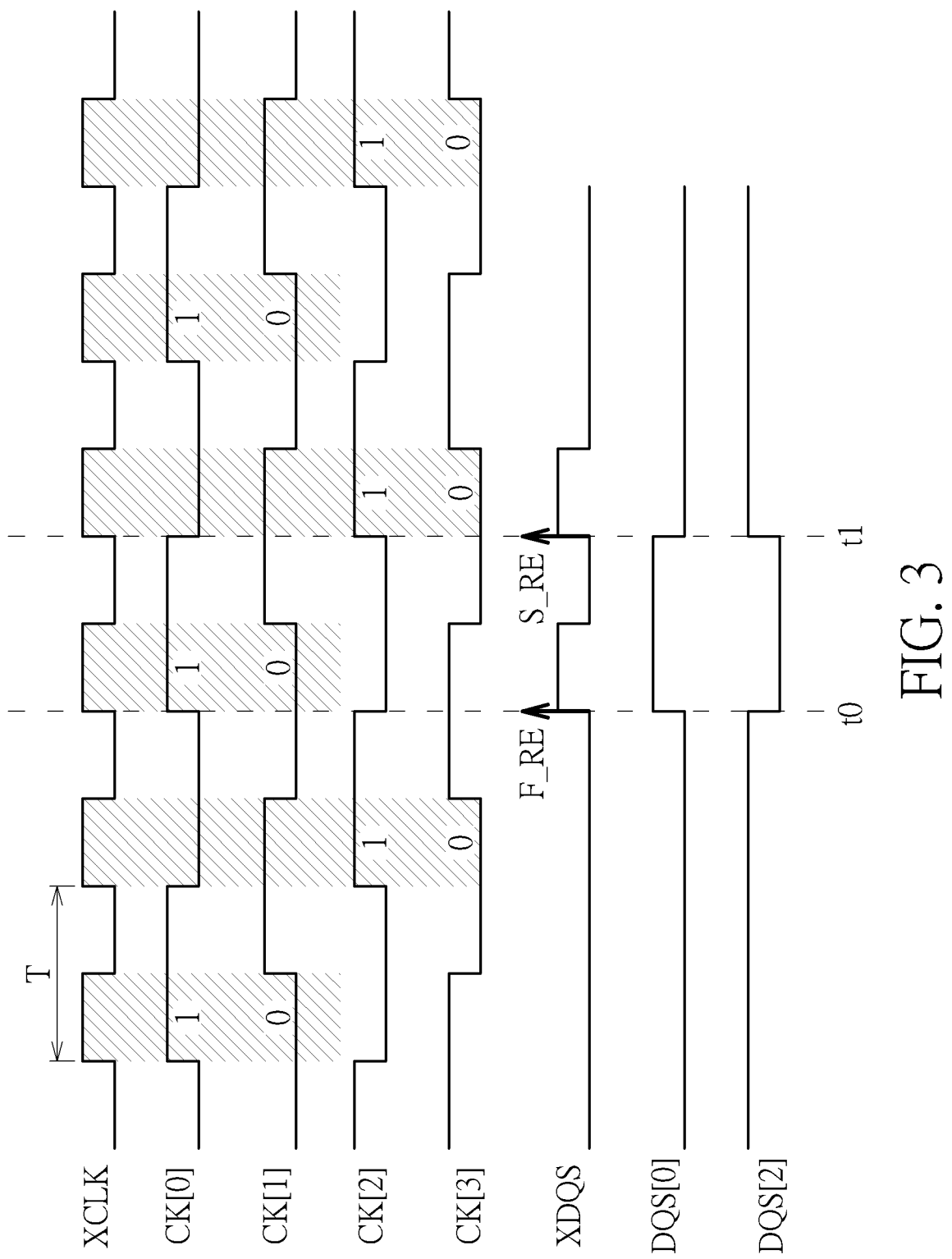
FIG. 3 is a timing diagram of associated signals of the write leveling system shown in FIG. 2 according to an embodiment of the present invention.

In detail, please refer to FIG. 2 in conjunction with FIG. 3. FIG. 2 is a diagram illustrating a write leveling system 200 according to an embodiment of the present invention, wherein the write leveling system 106 shown in FIG. 1 may be implemented by the write leveling system 200. FIG. 3 is a timing diagram of associated signals of the write leveling system 200 according to an embodiment of the present invention. As shown in FIG. 2, the write leveling system 200 may include a frequency divider 202, a signal processing circuit 204, a data control circuit 206, and a data pin 208. The frequency divider 202 may be arranged to perform a frequency dividing operation upon the clock signal XCLK to generate multiple frequency-divided clock signals CK[0]-CK[M]. In this embodiment, the frequency divider 202 may perform a frequency dividing operation with a divisor "2" upon the clock signal XCLK to generate 4 frequency-divided clock signals CK[0]-CK[3] (i.e. M=3) with different phases, wherein a frequency of each of the frequency-divided clock signals CK[0]-CK[3] is half a frequency of the clock signal XCLK, but the present invention is not limited thereto. In some embodiments, the frequency divider 202 may perform a frequency dividing operation with another divisor (e.g. "4") upon the clock signal XCLK to generate the frequency-divided clock signals.

In FIG. 3, the clock signal XCLK is a square signal with a period "T", and each of the frequency-divided clock signals CK[0]-CK[3] is a square signal with a period "2T", wherein the frequency-divided clock signal CK[0] is generated according to a first rising edge of the clock signal XCLK (e.g., a first rising edge of the frequency-divided clock signal CK[0] aligns with the first rising edge of the clock signal XCLK), the frequency-divided clock signal CK[1] is generated according to a first falling edge of the clock signal XCLK (e.g., a first rising edge of the frequency-divided clock signal CK[1] aligns with the first falling edge of the clock signal XCLK), the frequency-divided clock signal CK[2] is generated according to a second rising edge of the clock signal XCLK (e.g., a first rising edge of the frequency-divided clock signal CK[2] aligns with the second rising edge of the clock signal XCLK), and the frequency-divided clock signal CK[3] is generated according to a second falling edge of the clock signal XCLK (e.g., a first rising edge of the frequency-divided clock signal CK[3] aligns with the second falling edge of the clock signal XCLK).

The signal processing circuit 204 may be arranged to perform signal processing upon the DQS signal XDQS to generate 2 processed DQS signals DQS[0] and DQS[2]. In accordance with the specification of the DDR SDRAM, the DQS signal XDQS has 2 rising edges (e.g. a first rising edge F_RE and a second rising edge S_RE). The signal processing circuit 204 may generate one of the processed DQS signals DQS[0] and DQS[2] in response to the first rising edge F_RE of the DQS signal XDQS, and generate another of the processed DQS signals DQS[0] and DQS[2] in response to the second rising edge S_RE of the DQS signal XDQS.

As shown in FIG. 3, the DQS signal XDQS has the first rising edge F_RE and the second rising edge S_RE at time points t0 and t1, respectively. The signal processing circuit 204 may generate the processed DQS signal DQS[0] in response to the first rising edge F_RE at the time point t0 (e.g., a rising edge of the processed DQS signal DQS[0] aligns with the first rising edge F_RE of the DQS signal XDQS at the time point t0), and may generate the processed DQS signal DQS[2] in response to the second rising edge S_RE at the time point t1 (e.g., a rising edge of the processed DQS signal DQS[2] aligns with the second rising edge S_RE of the DQS signal XDQS at the time point t1), wherein the processed DQS signal DQS[0] is an inverse of the processed DQS signal DQS[2]. For example, the processed DQS signal DQS[0] is a signal that is initially at a low level (e.g., the logic value "0") and is converted into a high level (e.g., the logic value "1") when toggled, and the processed DQS signal DQS[2] is a signal that is initially at a high level (e.g., the logic value "1") and is converted into a low level (e.g., the logic value "0") when toggled.

For example, the signal processing circuit 204 may include a frequency divider and a signal capturing circuit. The frequency divider may be arranged to perform a frequency dividing operation with a divisor "2" upon the DQS signal XDQS to generate 4 frequency-divided DQS signals F_DQS[0]-F_DQS[3] with different phases, wherein a frequency of each of the frequency-divided DQS signals F_DQS[0]-F_DQS[3] is half a frequency of the DQS signal XDQS, the frequency-divided DQS signal F_DQS[0] is generated according to a first rising edge of the DQS signal XDQS (e.g., a rising edge of the frequency-divided DQS signal F_DQS[0] aligns with the first rising edge of the DQS signal XDQS), the frequency-divided DQS signal F_DQS[1] is generated according to a first falling edge of the DQS signal XDQS (e.g., a rising edge of the frequency-divided DQS signal F_DQS[1] aligns with the first falling edge of the DQS signal XDQS), the frequency-divided DQS signal F_DQS[2] is generated according to a second rising edge of the DQS signal XDQS (e.g., a rising edge of the frequency-divided DQS signal F_DQS[2] aligns with the second rising edge of the DQS signal XDQS), and the frequency-divided DQS signal F_DQS[3] is generated according to a second falling edge of the DQS signal XDQS (e.g., a rising edge of the frequency-divided DQS signal F_DQS[3] aligns with the second falling edge of the DQS signal XDQS). The signal capturing circuit may be arranged to only capture the frequency-divided DQS signals F_DQS[0] and F_DQS[2] for acting as the processed DQS signals DQS[0] and DQS[2], respectively.

This is for illustration only, and the present invention is not limited thereto. In some embodiments, the signal processing circuit 204 may generate the processed DQS signal DQS[0] in response to the second rising edge S_RE at the time point t1 (e.g., the rising edge of the processed DQS signal DQS[0] aligns with the second rising edge S_RE of the DQS signal XDQS at the time point t1), and may generate the processed DQS signal DQS[2] in response to the first rising edge F_RE at the time point t0 (e.g., the rising edge of the processed DQS signal DQS[2] aligns with the first rising edge F_RE of the DQS signal XDQS at the time point t0).

The data control circuit 206 may be arranged to receive the frequency-divided clock signals CK[0]-CK[3] and the processed DQS signals DQS[0] and DQS[2] from the frequency divider 202 and the signal processing circuit 204, respectively, and generate the data signal DQ according to the frequency-divided clock signals CK[0]-CK[3] and the processed DQS signals DQS[0] and DQS[2]. Specifically, the data control circuit 206 may utilize one of the processed DQS signals DQS[0] and DQS[2] to strobe both the frequency-divided clock signals CK[0] and CK[1] to generate a first strobed result FS_R, and utilize another of the processed DQS signals DQS[0] and DQS[2] to strobe both the frequency-divided clock signals CK[2] and CK[3] to generate a second strobed result SS_R, wherein the first strobed result FS_R is indicative of the frequency-divided clock signal CK[0] being at a high level (e.g., the logic value "1") and the frequency-divided clock signal CK[1] being at a low level (e.g., the logic value "0"), and the second strobed result SS_R is indicative of the frequency-divided clock signal CK[2] being at a high level (e.g., the logic value "1") and the frequency-divided clock signal CK[3] being at a low level (e.g., the logic value "0").

In embodiments shown in FIG. 2 and FIG. 3, under a condition that the processed DQS signal DQS[0] is generated in response to the first rising edge F_RE at the time point t0 and the processed DQS signal DQS[2] is generated in response to the second rising edge S_RE at the time point t1, both the frequency-divided clock signals CK[0] and CK[1] are strobed by the processed DQS signal DQS[0] to generate the first strobed result FS_R, and both the frequency-divided clock signals CK[2] and CK[3] are strobed by the processed DQS signal DQS[2] to generate the second strobed result SS_R. In practice, the processed DQS signal DQS[0] may also be generated in response to the second rising edge S_RE at the time point t1, and the processed DQS signal DQS[2] may also be generated in response to the first rising edge F_RE at the time point t0. In this situation, both the frequency-divided clock signals CK[0] and CK[1] are strobed by the processed DQS signal DQS[2] to generate the first strobed result FS_R, and both the frequency-divided clock signals CK[2] and CK[3] are strobed by the processed DQS signal DQS[0] to generate the second strobed result SS_R.

Figure 4:
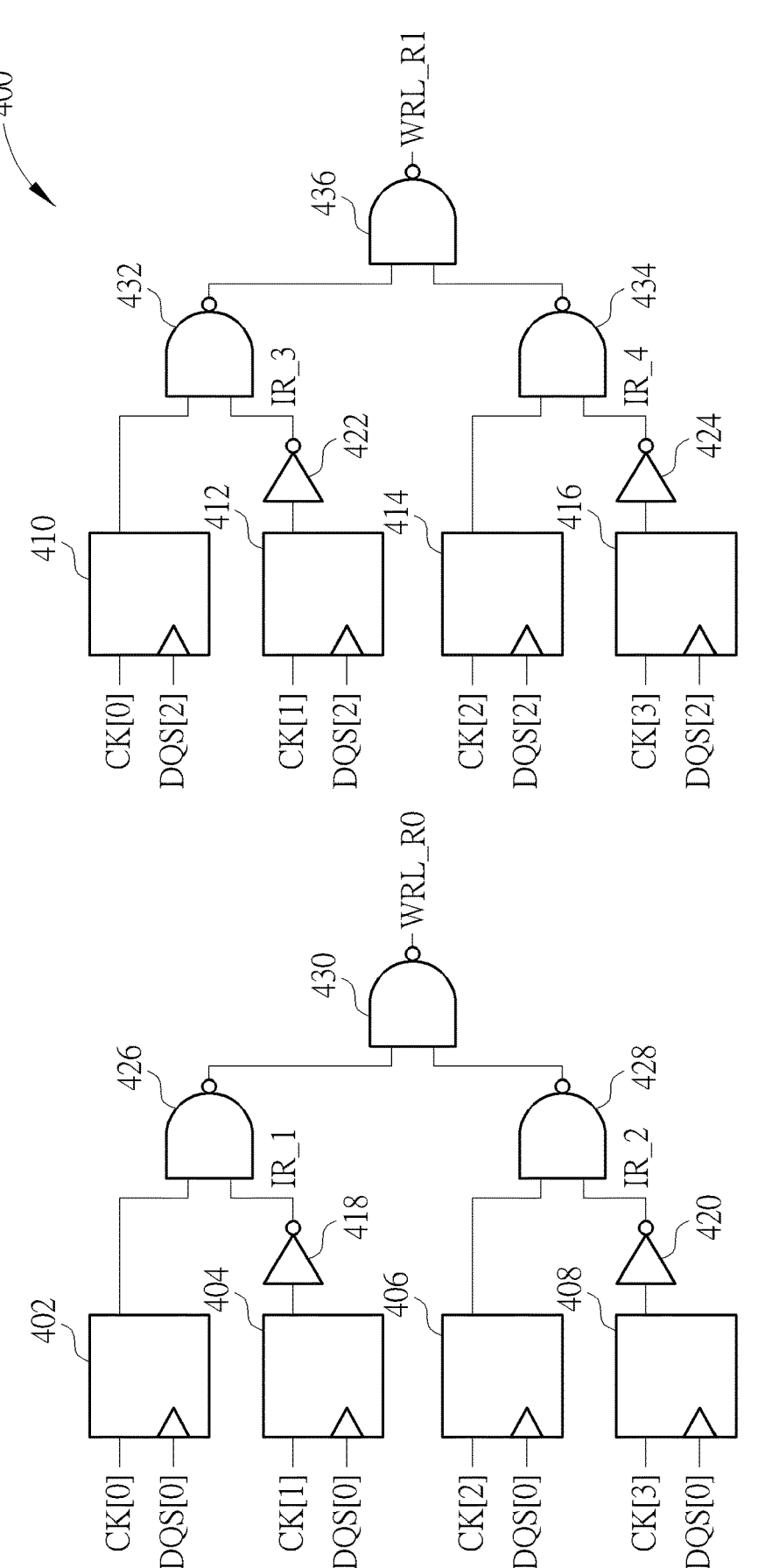
FIG. 4 is a diagram illustrating a first part of a data control circuit according to an embodiment of the present invention.
Figure 5:
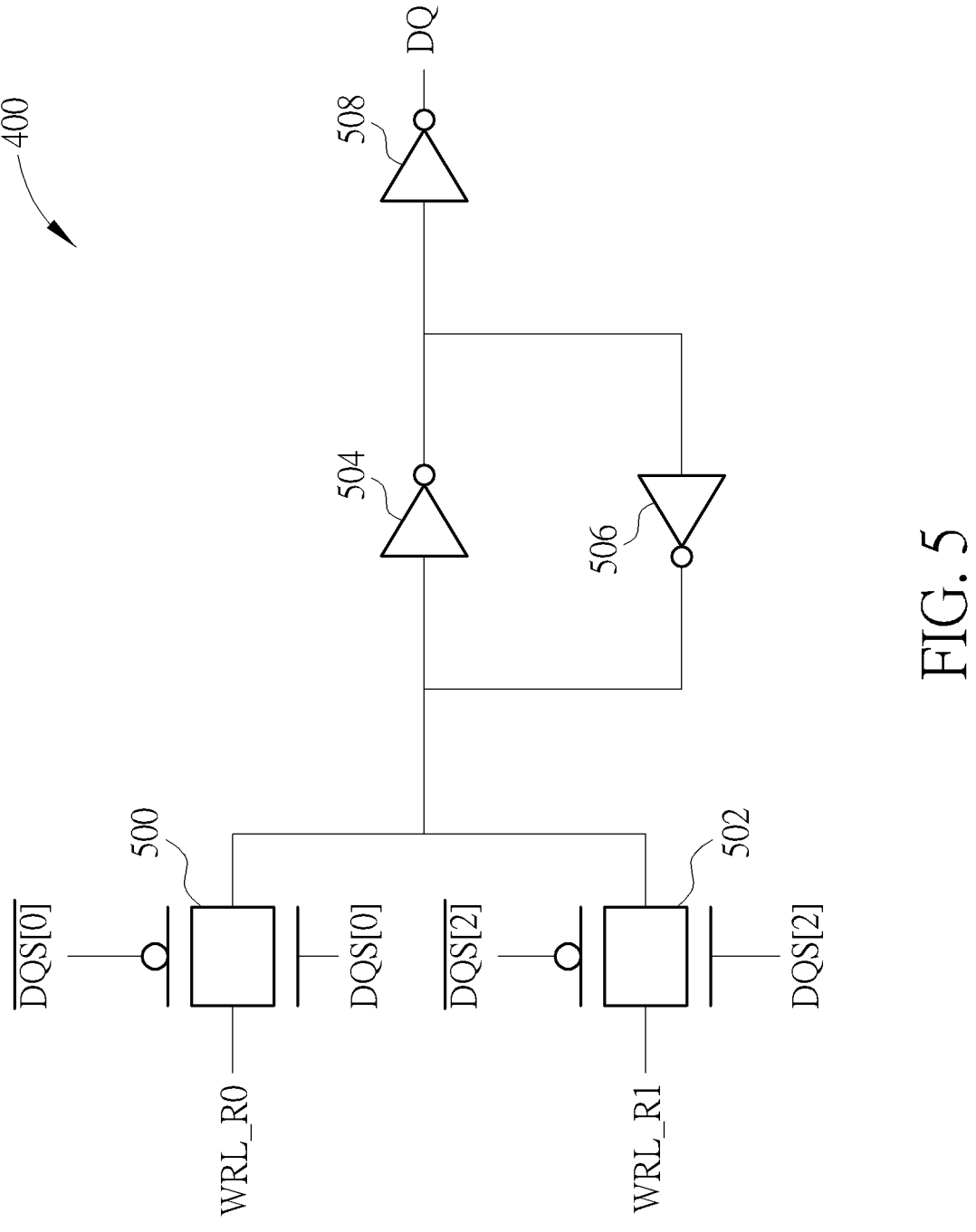
FIG. 5 is a diagram illustrating a second part of a data control circuit according to an embodiment of the present invention.

The data control circuit 206 may generate the data signal DQ according to the first strobed result FS_R and the second strobed result SS_R. In detail, please refer to FIG. 4 in conjunction with FIG. 5. FIG. 4 is a diagram illustrating a first part of a data control circuit 400 according to an embodiment of the present invention. FIG. 5 is a diagram illustrating a second part of the data control circuit 400 according to an embodiment of the present invention, wherein the data control circuit 206 shown in FIG. 2 may be implemented by the data control circuit 400. As shown in FIG. 4, the data control circuit 400 may include multiple D flip-flops (DFFs) 402, 404, 406, 408, 410, 412, 414, and 416, multiple inverters 418, 420, 422, and 424, and multiple NAND gate circuits 426, 428, 430, 432, 434, and 436.

For each of the DFFs 402, 404, 406, and 408, a clock port is arranged to receive the processed DQS signal DQS[0] (e.g. each of the DFFs 402, 404, 406, and 408 is triggered by the rising edge of the processed DQS signal DQS[0]), wherein an input port of the DFF 402 is arranged to receive the frequency-divided clock signal CK[0], an input port of the DFF 404 is arranged to receive the frequency-divided clock signal CK[1], an input port of the DFF 406 is arranged to receive the frequency-divided clock signal CK[2], and an input port of the DFF 408 is arranged to receive the frequency-divided clock signal CK[3]. That is, the DFF 402 is arranged to output a current value (e.g. the logical values "0" or "1") of the frequency-divided clock signal CK[0] at an output port in response to the rising edge of the processed DQS signal DQS[0], the DFF 404 is arranged to output the current value of the frequency-divided clock signal CK[1] at an output port in response to the rising edge of the processed DQS signal DQS[0], the DFF 406 is arranged to output the current value of the frequency-divided clock signal CK[2] at an output port in response to the rising edge of the processed DQS signal DQS[0], and the DFF 408 is arranged to output the current value of the frequency-divided clock signal CK[3] at an output port in response to the rising edge of the processed DQS signal DQS[0].

The inverter 418 has an input port coupled to the output port of the DFF 404 and an output port, and is arranged to perform an inverse operation upon an output result of the DFF 404 to generate an inverse result IR_1 at the output port. The inverter 420 has an input port coupled to the output port of the DFF 408 and an output port, and is arranged to perform an inverse operation upon an output result of the DFF 408 to generate an inverse result IR_2 at the output port. The NAND gate circuit 426 has a first input port coupled to the output port of the DFF 402, a second input port coupled to the output port of the inverter 418, and an output port. The NAND gate circuit 428 has a first input port coupled to the output port of the DFF 406, a second input port coupled to the output port of the inverter 420, and an output port. The NAND gate circuit 430 has a first input port coupled to the output port of the NAND gate circuit 426, a second input port coupled to the output port of the NAND gate circuit 428, and an output port, wherein a write leveling result WRL_R0 is output from the output port of the NAND gate circuit 430, and the write leveling result WRL_R0 may represent one of the first strobed result FS_R and the second strobed result SS_R.

Similarly, for each of the DFFs 410, 412, 414, and 416, a clock port is arranged to receive the processed DQS signal DQS[2] (e.g. each of the DFFs 410, 412, 414, and 416 is triggered by the rising edge of the processed DQS signal DQS[2]), wherein an input port of the DFF 410 is arranged to receive the frequency-divided clock signal CK[0], an input port of the DFF 412 is arranged to receive the frequency-divided clock signal CK[1], an input port of the DFF 414 is arranged to receive the frequency-divided clock signal CK[2], and an input port of the DFF 416 is arranged to receive the frequency-divided clock signal CK[3]. That is, the DFF 410 is arranged to output a current value (e.g. the logical values "0" or "1") of the frequency-divided clock signal CK[0] at an output port in response to the rising edge of the processed DQS signal DQS[2], the DFF 412 is arranged to output the current value of the frequency-divided clock signal CK[1] at an output port in response to the rising edge of the processed DQS signal DQS[2], the DFF 414 is arranged to output the current value of the frequency-divided clock signal CK[2] at an output port in response to the rising edge of the processed DQS signal DQS[2], and the DFF 416 is arranged to output the current value of the frequency-divided clock signal CK[3] at an output port in response to the rising edge of the processed DQS signal DQS[2].

The inverter 422 has an input port coupled to the output port of the DFF 412 and an output port, and is arranged to perform an inverse operation upon an output result of the DFF 412 to generate an inverse result IR_3 at the output port. The inverter 424 has an input port coupled to the output port of the DFF 416 and an output port, and is arranged to perform an inverse operation upon an output result of the DFF 416 to generate an inverse result IR_4 at the output port. The NAND gate circuit 432 has a first input port coupled to the output port of the DFF 410, a second input port coupled to the output port of the inverter 422, and an output port. The NAND gate circuit 434 has a first input port coupled to the output port of the DFF 414, a second input port coupled to the output port of the inverter 424, and an output port. The NAND gate circuit 436 has a first input port coupled to the output port of the NAND gate circuit 432, a second input port coupled to the output port of the NAND gate circuit 434, and an output port, wherein a write leveling result WRL_R1 is output from the output port of the NAND gate circuit 436, and the write leveling result WRL_R1 may represent another of the first strobed result FS_R and the second strobed result SS_R.

For example, under a condition that the processed DQS signal DQS[0] is generated in response to the first rising edge F_RE of the DQS signal XDQS and the processed DQS signal DQS[2] is generated in response to the second rising edge S_RE of the DQS signal XDQS, the write leveling result WRL_R0 represents the first strobed result FS_R and the write leveling result WRL_R1 represents the second strobed result SS_R. For another example, under a condition that the processed DQS signal DQS[0] is generated in response to the second rising edge S_RE of the DQS signal XDQS and the processed DQS signal DQS[2] is generated in response to the first rising edge F_RE of the DQS signal XDQS, the write leveling result WRL_R0 represents the second strobed result SS_R and the write leveling result WRL_R1 represents the first strobed result FS_R.

As shown in FIG. 5, the data control circuit 400 may further include multiple transmission gate circuits 500 and 502 and multiple inverters 504, 506, and 508. Each of the transmission gate circuits 500 and 502 may be a complementary metal-oxide-semiconductor (CMOS) including an N-type MOSFET and a P-type MOSFET. The transmission gate circuit 500 has an input port receiving the write leveling result WRL_R0, a control port receiving the processed DQS signal DQS[0] (e.g., a gate terminal of the N-type MOSFET receiving the processed DQS signal DQS[0], and a gate terminal of the P-type MOSFET receiving an inverse of the processed DQS signal DQS[0] (labeled as "$\overline{DQS[0]}$" in FIG. 5)), and an output port. The transmission gate circuit 502 has an input port receiving the write leveling result WRL_R1, a control port receiving the processed DQS signal DQS[2] (e.g., a gate terminal of the N-type MOSFET receiving the processed DQS signal DQS[2], and a gate terminal of the P-type MOSFET receiving an inverse of the processed DQS signal DQS[2] (labeled as "$\overline{DQS[2]}$" in FIG. 5)), and an output port. The inverter 504 has an input port coupled to the output port of the transmission gate circuit 500 and the output port of the transmission gate circuit 502 and an output port. The inverter 506 has an input port coupled to the output port of the inverter 504 and an output port coupled to the input port of the inverter 504. The inverter 508 has an input port coupled to the output port of inverter 504 and an output port, wherein the data signal DQ is generated at the output port of the inverter 508. After the data signal DQ is generated, the data pin 208 may be arranged to receive the data signal DQ from the data control circuit 206/400, and transmit the data signal DQ to the memory controller 102, wherein the memory controller 102 may determine whether to delay the DQS signal XQS according to the data signal DQ, in order to successfully perform a data writing operation.

In summary, compared with a case where a clock signal and a DQS signal are transmitted from a memory controller to a DDR SDRAM through multiple delay circuits (e.g., multiple inverters) for performing a write leveling operation, the write leveling system of the present invention performs the write leveling operation by frequency division and data control within the DDR SDRAM, which can avoid signal delay problems caused by process, voltage, and temperature (PVT) variation for the delay circuits (e.g., skew margin reduction between the DQS signal and the clock signal during a data writing operation). In this way, the accuracy of the data writing operation can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A write leveling system, comprising:
   a frequency divider, arranged to perform a frequency dividing operation upon a clock signal to generate multiple frequency-divided clock signals;
   a signal processing circuit, arranged to perform signal processing upon a data strobe signal to generate multiple processed data strobe signals; and
   a data control circuit, arranged to generate a data signal according to the multiple frequency-divided clock signals and the multiple processed data strobe signals, wherein the data signal is provided to a memory controller, and the memory controller determines whether to delay the data strobe signal according to the data signal;
   wherein the multiple processed data strobe signals comprise a first processed data strobe signal and a second processed data strobe signal; the data strobe signal has a first rising edge and a second rising edge; one of the first processed data strobe signal and the second processed data strobe signal is generated in response to the first rising edge of the data strobe signal; a first rising edge of said one of the first processed data strobe signal and the second processed data strobe signal aligns with the first rising edge of the data strobe signal; another of the first processed data strobe signal and the second processed data strobe signal is generated in response to the second rising edge of the data strobe signal; and a first rising edge of said another of the first processed data strobe signal and the second processed data strobe signal aligns with the second rising edge of the data strobe signal.

2. The write leveling system of claim 1, wherein the first processed data strobe signal is an inverse of the second processed data strobe signal.

3. The write leveling system of claim 1, wherein the multiple frequency-divided clock signals comprise a first frequency-divided clock signal, a second frequency-divided clock signal, a third frequency-divided clock signal, and a fourth frequency-divided clock signal.

4. The write leveling system of claim 3, wherein the first frequency-divided clock signal is generated according to a first rising edge of the clock signal, the second frequency-divided clock signal is generated according to a first falling edge of the clock signal, the third frequency-divided clock signal is generated according to a second rising edge of the clock signal, and the fourth frequency-divided clock signal is generated according to a second falling edge of the clock signal.

5. The write leveling system of claim 4, wherein both the first frequency-divided clock signal and the second frequency-divided clock signal are strobed by one of the first processed data strobe signal and the second processed data strobe signal to generate a first strobed result; and both the third frequency-divided clock signal and the fourth frequency-divided clock signal are strobed by another of the first processed data strobe signal and the second processed data strobe signal to generate a second strobed result.

6. The write leveling system of claim 5, wherein the first strobed result indicates that in response a first rising edge of said one of the first processed data strobe signal and the second processed data strobe signal, the first frequency-divided clock signal toggles from a first level to a second level, and the second frequency-divided clock signal is at the first level; the second strobed result indicates that in response to a first rising edge of said another of the first processed data strobe signal and the second processed data strobe signal, the third frequency-divided clock signal toggles from the first level to the second level, and the fourth frequency-divided clock signal is at the first level; and the second level is higher than the first level.

7. The write leveling system of claim 5, wherein the data signal is generated according to the first strobed result and the second strobed result.

8. The write leveling system of claim 3, wherein the data control circuit comprises:
a first D flip-flop (DFF), having a first clock port, a first input port, and a first output port, wherein the first clock port is arranged to receive one of the first processed data strobe signal and the second processed data strobe signal, and the first input port is arranged to receive the first frequency-divided clock signal;
a second DFF, having a second clock port, a second input port, and a second output port, wherein the second clock port is arranged to receive the one of the first processed data strobe signal and the second processed data strobe signal, and the second input port is arranged to receive the second frequency-divided clock signal;
a third DFF, having a third clock port, a third input port, and a third output port, wherein the third clock port is arranged to receive the one of the first processed data strobe signal and the second processed data strobe signal, and the third input port is arranged to receive the third frequency-divided clock signal; and
a fourth DFF, having a fourth clock port, a fourth input port, and a fourth output port, wherein the fourth clock port is arranged to receive the one of the first processed data strobe signal and the second processed data strobe signal, and the fourth input port is arranged to receive the fourth frequency-divided clock signal.

9. The write leveling system of claim 8, wherein the data control circuit further comprises:
a first inverter, having an input port coupled to the second output port of the second DFF and an output port;
a second inverter, having an input port coupled to the fourth output port of the fourth DFF and an output port;
a first NAND gate circuit, having a first input port coupled to the output port of the first inverter, a second input port coupled to the first output port of the first DFF, and an output port;
a second NAND gate circuit, having a first input port coupled to the output port of the second inverter, a second input port coupled to the third output port of the third DFF, and an output port; and
a third NAND gate circuit, having a first input port coupled to the output port of the first NAND gate circuit, a second input port coupled to the output port of the second NAND gate circuit, and an output port.

10. The write leveling system of claim 9, wherein in response to the one of the first processed data strobe signal and the second processed data strobe signal being the first processed data strobe signal, a first write leveling result is output from the output port of the third NAND gate circuit; in response to the one of the first processed data strobe signal and the second processed data strobe signal being the second processed data strobe signal, a second write leveling result is output from the output port of the third NAND gate circuit; and the data signal is generated according to the first write leveling result and the second write leveling result.

11. The write leveling system of claim 10, wherein the data control circuit further comprises:
a first transmission gate circuit, having an input port receiving the first write leveling result, a control port receiving the first processed data strobe signal, and an output port;
a second transmission fate circuit, having an input port receiving the second write leveling result, a control port receiving the second processed data strobe signal, and an output port;
a first inverter, having an input port coupled to the output port of the first transmission gate circuit and the output port of the second transmission fate circuit and an output port;
a second inverter, having an input port coupled to the output port of the first inverter and an output port coupled to the input port of the first inverter; and
a third inverter, having an input port coupled to the output port of the first inverter and an output port, wherein the data signal is generated at the output port of the third inverter.

12. A storage device, comprising:
a memory controller;
a write leveling system, comprising:
a frequency divider, arranged to receive a clock signal from the memory controller, and perform frequency dividing operation upon the clock signal to generate multiple frequency-divided clock signals;
a signal processing circuit, arranged to receive a data strobe signal from the memory controller, and perform signal processing upon the data strobe signal to generate multiple processed data strobe signals;
a data control circuit, arranged to generate a data signal according to the multiple frequency-divided clock signals and the multiple processed data strobe signals; and
a data pin, arranged to receive the data signal from the data control circuit, and transmit the data signal to the memory controller, wherein the memory controller determines whether to delay the data strobe signal according to the data signal;
wherein the multiple processed data strobe signals comprise a first processed data strobe signal and a second processed data strobe signal; the data strobe signal has a first rising edge and a second rising edge; one of the first processed data strobe signal and the second processed data strobe signal is generated in response to the first rising edge of the data strobe signal; a first rising edge of said one of the first processed data strobe signal and the second processed data strobe signal aligns with the first rising edge of the data strobe signal; another of the first processed data strobe signal and the second processed data strobe signal is generated in response to the second rising edge of the data strobe signal; and a first rising edge of said another of the first processed data strobe signal and the second processed data strobe signal aligns with the second rising edge of the data strobe signal.

* * * * *